(12) United States Patent
DeFlumere et al.

(10) Patent No.: US 7,973,272 B2
(45) Date of Patent: Jul. 5, 2011

(54) INTERFACE TECHNIQUES FOR COUPLING A MICROCHANNEL PLATE TO A READOUT CIRCUIT

(75) Inventors: Michael E. DeFlumere, Winchester, MA (US); Paul W. Schoeck, Townsend, MA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 280 days.

(21) Appl. No.: 12/400,505

(22) Filed: Mar. 9, 2009

(65) Prior Publication Data
US 2010/0224764 A1    Sep. 9, 2010

(51) Int. Cl.
*H01J 40/14* (2006.01)
(52) U.S. Cl. .................. 250/214 VT; 250/207
(58) Field of Classification Search ............ 250/214 VT, 250/207, 214 R, 307–309, 397, 286, 287; 313/105 CM, 103 CM, 105 R, 532–535
See application file for complete search history.

(56) References Cited

U.S. PATENT DOCUMENTS 5,544,722 A    8/1996   McKenzie
7,485,872 B2 * 2/2009   Frisch et al. ................ 250/397

OTHER PUBLICATIONS

Martin et al., Characterization of a Microchannel Plate Photomultiplier Tube with High Sensitivity GaAs Photocathode, 6 pages.
Microchannel Plates and MCP Detectors and Imaging Systems, downloaded on Jan. 28, 2009 from http://www.dmphotonics.com/MCP_MCPImageIntensifiers/mcp_references.htm, 14 pages.
"Medipix", downloaded on Feb. 17, 2009 from http://en.wikipedia/wiki/Medipix, 2 pages.
Tremsin et al., The Latest Developments of High Gain Si Microchannel Plates; Proc. SPIE, vol. 4854, "Future EUV-UV and Visible Space Astrophysics Missions and Instrumentation", Hawaii (2002); 10 pages.

* cited by examiner

*Primary Examiner* — Que T Le
(74) *Attorney, Agent, or Firm* — Finch & Maloney PLLC (57) ABSTRACT

Techniques are disclosed that can be used to interface a microchannel plate (MCP) with readout circuitry. The techniques can be employed, for instance, with MCP based devices used in a numerous sensing/detection applications, and are particularly suitable for applications where it is desirable to interface an MCP having a relatively large active area to a readout circuit having a relatively smaller active area. The interface effectively decouples anode geometry from ROIC geometry and may also be configured with flexible anode pad geometry, which allows for compensation of optical blur variations as well as a very high fill factor. The interface can be made using standard semiconductor materials and photolithography techniques, and can be configured with thermal expansion qualities that closely track or otherwise match that of the readout circuitry.

20 Claims, 7 Drawing Sheets

INTERFACE TECHNIQUES FOR COUPLING A MICROCHANNEL PLATE TO A READOUT CIRCUIT

RELATED APPLICATIONS

This application is related to U.S. application Ser. No. 12/400,490, filed Mar. 9, 2009, and titled "Selective Channel Charging for Microchannel Plate" which is herein incorporated by reference in its entirety.

FIELD OF THE INVENTION

The invention relates to sensors such as microchannel plates (MCPs), and more particularly, to techniques for interfacing sensors to readout circuitry.

BACKGROUND OF THE INVENTION

As is known, a microchannel plate (MCP) includes an array of small diameter tubes or channels, each of which operates as an independent electron multiplier in the presence of an electric field applied to the MCP. As a signal (e.g., an electron, photon, ion) enters the input end of a given channel and passes through that channel, it impacts the channel walls thereby producing so-called secondary electrons that then also propagate through the channel and impact the channel wall to produce even more secondary electrons. This repetitive addition of electrons effectively amplifies the original input signal by several orders of magnitude, depending on factors such as strength of the electric field and channel geometry.

A collector electrode (generally referred to as an anode) is provided at the other end of the channel to collect the multitude of electrons (sometime referred to as an electron pulse or cloud). While some MCP designs have a single anode to collect total current produced by all channels, other MCP designs have a multi-anode configuration where each channel has a dedicated anode. Such a multi-anode MCP configuration is particularly useful when it is necessary to maintain spatial relationships of input signals (e.g., such as the case with imaging applications).

MCP devices can be used in a number of detectors for military, scientific and commercial applications. In general, a detector that employs MCP technology includes a converter (e.g., photocathode) to convert the incident photons into electrons, one or more MCPs that operate to amplify the initial electron or photon event into an electron cloud, and a readout circuit for receiving each electron cloud and converting it into a signal having qualities suitable for subsequent signal processing. MCPs are in general sensitive to photons by a much lower efficiency than a photocathode. In some cases, however, where the MCP is directly sensitive to the target event or particle, no converter is needed (e.g., such as in ion detection in mass-spectrometry applications, and UV and VUV radiation detection applications). In other cases, the converter may further include a scintillator that converts incident particles into photons that are subsequently converted to electrons by a photocathode or other suitable conversion mechanism.

A problem associated with conventional MCP-based detectors is that MCPs typically have large active areas (active areas of 18 and 25 mm in diameter are standard), which are useful in collecting signal, but require a correspondingly large sized readout integrated circuit (ROIC). In short, it is difficult and expensive to fabricate a ROIC that is compatible with such large sized MCP active areas.

One solution to this problem is to effectively reduce the size of the image produced by the MCP sensor by using an optical taper (which typically involves a conversion from electrons to light at the MCP output using a phosphor), thereby allowing a smaller ROIC to be used. However, this conversion from electrons to photons and then back to electrons for signal processing increases the cost, size, weight and power of the detector. It also reduces the system modulation transfer function (MTF), detection efficiency, and reliability. Another solution involves abutting a plurality of ROICs to form a larger readout device. Large arrays can also be made by field stitching. Certain applications, however, cannot tolerate the increased cost and/or loss of pixels at the interface between ROICs associated with such options.

There is a need, therefore, for techniques that can be used to interface an MCP device with readout circuitry.

SUMMARY OF THE INVENTION

One embodiment of the present invention provides a readout reducer device for interfacing a multi-channel sensor with a readout integrated circuit (ROIC). The device includes an array of anode pads, each anode pad for receiving a detection signal from a corresponding channel of the sensor. The device further includes a ROIC interconnect having an array of ROIC pads that couples to a corresponding array of the ROIC. The device further includes at least one interconnect layer for physically connecting each anode pad to a corresponding one of the ROIC pads. The array of anode pads is a different size than the array of ROIC pads (in one such case, the array of anode pads is larger than the array of ROIC pads). The sensor can be, for example, a microchannel plate (MCP). Other suitable multi-channel sensors include, for instance, an array of photodiodes selected from materials that respond to photons in a band of interest (e.g., UV to IR), or an array of avalanche photodiodes responsive to the band of interest. In one particular case, the device includes first and second interconnect layers, wherein the first interconnect layer physically connects some of the anode pads to their respective ROIC pads, and the second interconnect layer physically connects others of the anode pads to their respective ROIC pads. The at least one interconnect layer can be formed, for example, on a silicon substrate (e.g., to provide a good thermal match with a silicon ROIC). In another particular case, the at least one interconnect layer includes a conductive run, contact pad, and/or a metallized via to physically connect an anode pad to a corresponding ROIC pad. In another particular case, at least some of the anode pads of the anode array have a first shape and/or size and other anode pads of the anode array have a second shape and/or size. In another particular case, the array of anode pads is curved and the ROIC interconnect is planar. In another particular case, the anode array has denser pixel resolution in some areas as compared to other areas of the anode array. In another particular case, the at least one interconnect layer includes a plurality of varying length conductive runs, each having geometry configured to provide a propagation delay within a target range. In one such case, a short conductive run has a narrower width than a relatively longer conductive run, so that the short conductive run has a propagation delay that is about the same as propagation delay of the long conductive run. The readout reducer device may be configured with numerous variations and configurations as will be apparent in light of this disclosure. Any combination of the features and/or the various cases discussed herein may be readily employed.

Another embodiment of the present invention provides a system that includes one or more optics for collecting photons from a scene within a field of view (FOV) of the system, and a converter for converting photons collected by the optics to electrons. The system further includes a microchannel plate (MCP) having a plurality of channels, each channel for amplifying an electron output by the converter into an electron cloud. The system further includes a readout integrated circuit (ROIC) for converting each electron cloud into a signal for subsequent signal processing. The system further includes a readout reducer device for interfacing the MCP with the ROIC. The system further includes a readout reducer device, which may be configured as previously described, with numerous variations and configurations apparent in light of this disclosure. Each of the MCP, readout reducer device, and ROIC are included in a vacuum.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 2b illustrates an example array of anode pads for the readout reducer shown in FIG. 2a.

FIG. 3b illustrates an exploded perspective view of the readout reducer shown in FIG. 3a.

Note that the figures are not drawn to scale and actual geometries and layer thicknesses will be apparent in light of the corresponding written description. Further note that the use of "front side" and "back side" herein is for simply differentiating one surface from another with respect to the page upon which they are depicted, and is not intended to imply any limitation that front or back might otherwise suggest.

DETAILED DESCRIPTION OF THE INVENTION

Techniques are disclosed that can be used to interface a microchannel plate (MCP) with readout circuitry. The techniques can be employed, for instance, with MCP based devices used in a numerous sensing/detection applications, and are particularly suitable for applications where it is desirable to interface an MCP having a relatively large active area to a readout circuit having a relatively smaller active area. The interface can be carried out on a pixel-to-pixel basis and effectively reduces a relatively large MCP image to a smaller ROIC image. The interface may also be configured with flexible anode pad geometry, which allows for compensation of optical blur variations and very high fill factor. The interface can be made using standard semiconductor materials and photolithography techniques, and can be configured with thermal expansion qualities that closely track or otherwise match that of the readout circuitry.

General Overview

As previously explained, MCP sensors typically have large active areas that are useful in collecting signal. For instance, active areas having diameters of 18 mm and 25 mm are standard sizes. Even larger active areas (e.g., 100 mm diameter) are available. This relatively large active area translates to a large array of anode pads that delineate pixels. The techniques described herein may be embodied in an MCP readout interface or "readout reducer" that connects each pixel of a smaller readout circuit array (e.g., 14×14 mm array, or other relatively small size) to a corresponding pixel represented by an anode pad of a larger array defined by the active area of the MCP. This approach allows a standard readout integrated circuit (ROIC) to be used with any large format MCP. Numerous MCP and ROIC array size combinations can equally benefit, as will be apparent in light of this disclosure.

The MCP readout reducer may be implemented, for example, on a silicon substrate which is well-suited to thermal match a silicon ROIC. The readout reducer can be fabricated using standard semiconductor manufacturing techniques (e.g., photolithography including selective masking, deposition, and etching). Other suitable semiconductor materials can also be used to fabricate the readout reducer, so long as relevant physical properties (e.g., coefficient of thermal expansion) of the material sufficiently match those properties associated with the material from which the ROIC is fabricated. Silicon alternatives include, for example, gallium arsenide, indium gallium arsenide, and indium phosphide.

In addition, conventional MCP based devices uses a constant size pixel over the array. However, and in accordance with one embodiment of the present invention, the readout reducer enables a variable size and shape of the pixel to be used over the field of view (FOV) of the detector of which the MCP is part. This allows for compensation of optical blur variations over the FOV and provides near 100% fill factor. Moreover, the pixel distribution can be tailored for a given application, such as increasing the number of pixels in the center of the readout to improve resolution (e.g., such as in the way human eyes operate). Such a configuration is of particular interest for systems that are used for tracking and guidance.

Detector System

Figure 1:
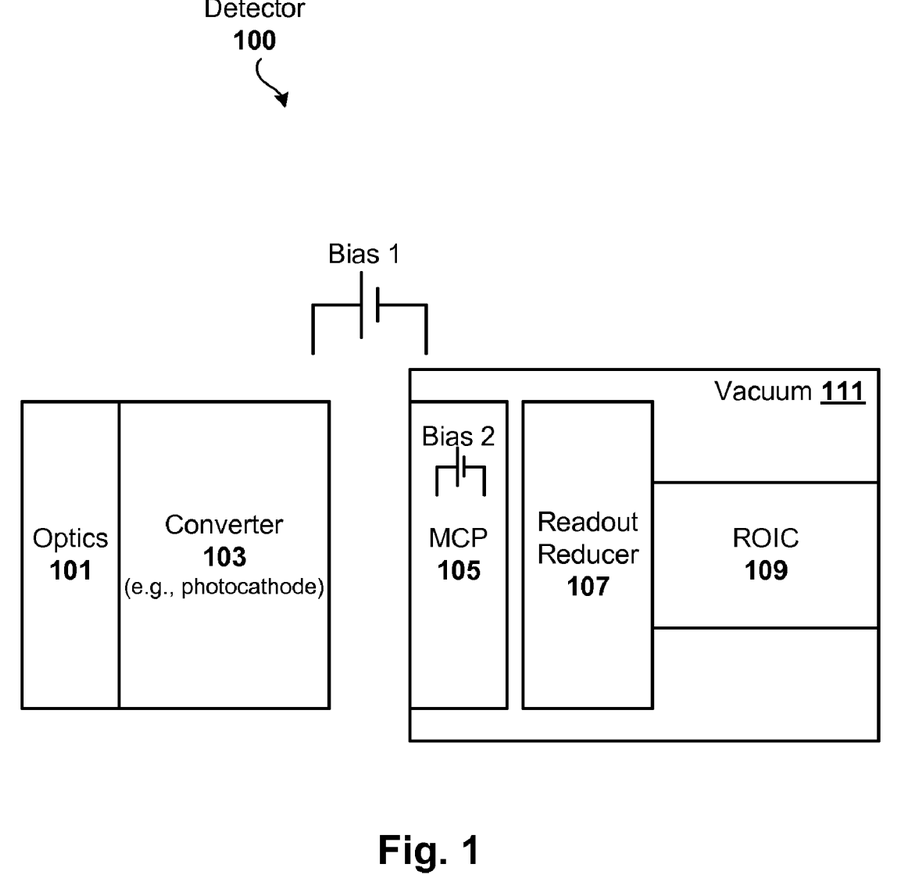
FIG. 1 illustrates a detector configured in accordance with an embodiment of the present invention.

FIG. 1 illustrates a detector system 100 configured in accordance with an embodiment of the present invention. As can be seen, the system 100 includes optics 101, converter 103, microchannel plate (MCP) 105, readout reducer 107, and readout integrated circuit (ROIC) 109. Each of the MCP 105, readout reducer 107, and ROIC 109 are included in a vacuum 113. A bias is provided between the converter 103 and input of the MCP 105, as typically done. Such a system can be used, for example, for any number of image intensifier applications such as night vision, surveillance, or other such applications based on light reflection or emission.

The optics 101 can be implemented with conventional technology, and operates to collect scene data from the system's field of view (FOV) and focuses or otherwise provides that data to the converter 103. As is known, the type and complexity of the optics can vary depending on a number of factors including desired performance, acceptance angle, cost, and wavelengths of interest. In any such cases, photons of interest in the system's FOV are collected and provided to the converter 103 for conversion to electrons via the photoelectric effect. The converter 103 can also be implemented with conventional technology, such as a photocathode. An electron output by the converter 103 is accelerated toward the MCP 105 due to the bias (Bias 1) between the converter 103 and the MCP 105 input. Bias 1 can be, for example, about 300 VDC or any voltage suitable for negatively biasing the converter 103 with respect to the MCP 105.

The MCP 105 can also be implemented with conventional technology, and as previously explained generally includes an array of small diameter tubes or channels, each of which operates as an independent electron multiplier in the presence of a bias (Bias 2) applied to the MCP (e.g., 3000 VDC, or other suitable MCP bias). As an electron enters the input end of a given channel and passes through that channel, it impacts the channel walls thereby producing secondary electrons that then also propagate through the channel and impact the channel wall to produce even more secondary electrons. This repetitive addition of electrons amplifies the original input signal, and the resulting electron cloud is provided at the output of the MCP 105. In other embodiments, MCP 105 can be implemented as described in the previously incorporated U.S. application Ser. No. 12/400,490, which allows for selective channel charging via the use of dynamic charging switches at the output of each MCP channel. Such a switching scheme allows for high dynamic range and prevents thermal runaway. The switches only turn on momentarily, and therefore allow the strip current (charging current) to flow, when a space charge (electron cloud) is produced at the channel output. Thus, the switches are automatically or dynamically turned on only when they need to be, to allow for channel charging. Note that two or more MCPs can be coupled in series to provide even greater amplification for a given input event, as is sometimes done. For instance, an assembly of two MCPs (sometimes called a Chevron or V-stack), or three MCPs (sometimes called a Z-stack) may be used in place of single MCP 105. In short, any number of MCPs can be used in accordance with an embodiment of the present invention, and the number of MCPs required will depend on demands and various particulars of the target application.

The output of the MCP 105 is coupled to the readout reducer 107, which includes a collector electrode (generally referred to as an anode). The anode of the reducer 107 is segmented into a number of anode pads, with each pad corresponding to a tube/channel output of the MCP 105. A gap is provided between the output of the MCP 105 and the segmented anode of the reducer 107. The gap is generally small (e.g., on the order of 0.2 mm to 0.4 mm), within good design practice, to minimize the spreading of the electron cloud on the anode. Each anode pad collects the electron pulse or cloud output by a corresponding MCP channel for a single MCP, and for multiple channels when two or MCPs are used.

Note that MCP 105 can also be replaced with other multi-channel sensors. For instance, sensor 105 could be implemented with an array of photodiodes selected from materials that respond to photons in a band of interest (e.g., UV to IR), or an array of avalanche photodiodes responsive to photons in the band of interest. Other suitable multi-channel sensors that can benefit from readout reducer 107 will be apparent in light of this disclosure.

The readout reducer 107 further includes a ROIC interconnect that is configured to interface with the ROIC 109. In operation, the readout reducer 107 transfers the signals from the relatively large anode pad array to the smaller array of the ROIC interconnect. The readout reducer 107 may include one or more middle interconnect layers between the anode and ROIC interconnect, wherein each interconnect layer provides conductive runs and/or vias that operatively couple anode pads to corresponding ROIC interconnect pads/bumps. The number of middle interconnect layers depends on factors such as the number of pixels included in the array of the detector system as well as the fabrication techniques employed (which effectively define geometries and feature sizes of the resulting circuitry). Further details of the readout reducer 107 will be provided in turn and with reference to FIGS. 2a-4.

The ROIC 109, which can be implemented with conventional technology such as a Medipix ROIC, includes a pad array that corresponds to the ROIC interconnect array of the readout reducer 107. As is known, Medipix is a family of photon counting pixel detectors developed by an international collaboration hosted by CERN. In any case, the ROIC 109 can be secured to the ROIC interconnect of the readout reducer 107 using conventional technology, such as bump bonding. Each anode pad (and its corresponding ROIC interconnect pad and ROIC pad) effectively corresponds to a pixel of the detector 100. The ROIC 109 receives each pixel signal and converts it into a signal having qualities suitable for subsequent signal processing as conventionally done (e.g., image analysis, discrimination, etc).

Readout Reducer

Figure 2A:
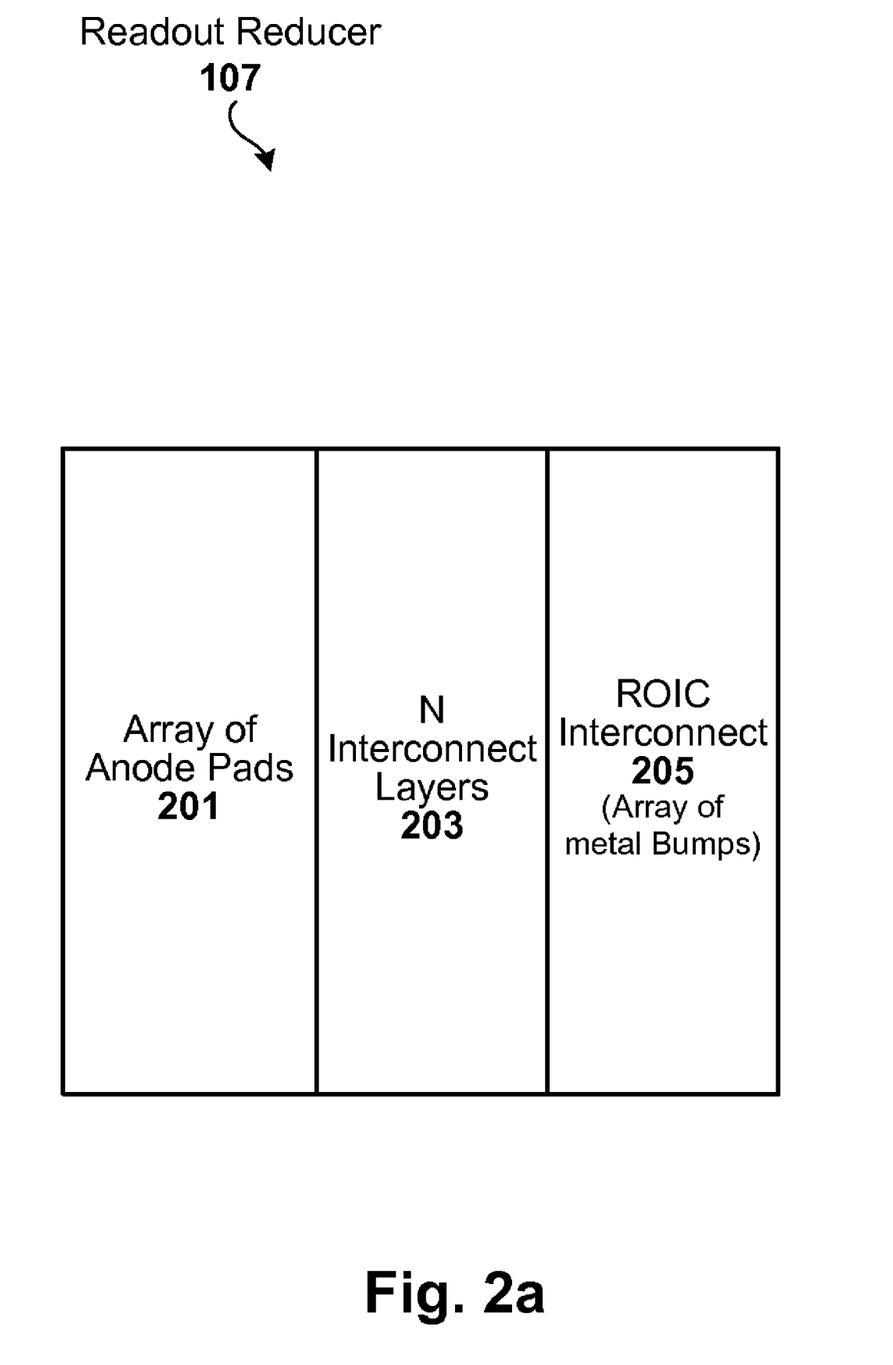
FIG. 2a illustrates the readout reducer shown in FIG. 1, configured in accordance with an embodiment of the present invention.

FIG. 2a illustrates a side view of the readout reducer 107 shown in FIG. 1, configured in accordance with an embodiment of the present invention. As can be seen, the reducer 107 includes three main sections: an array of anode pads 201, N interconnect layers 203, and a ROIC interconnect 205. As previously explained, the number N of interconnect layers 203 can vary depending on particulars of the given application, wherein N can be 1 or greater.

Figure 2B:
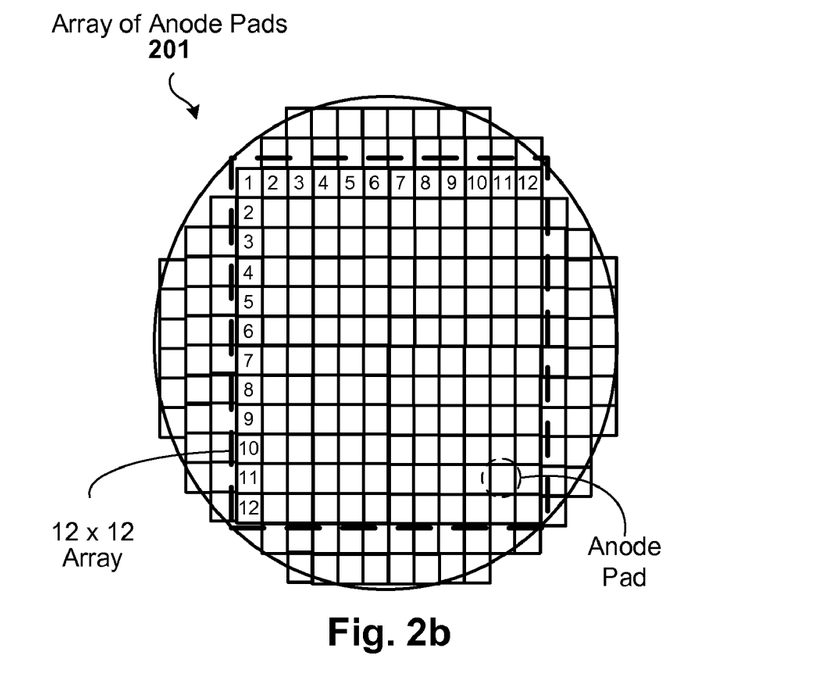
Figure 2C:
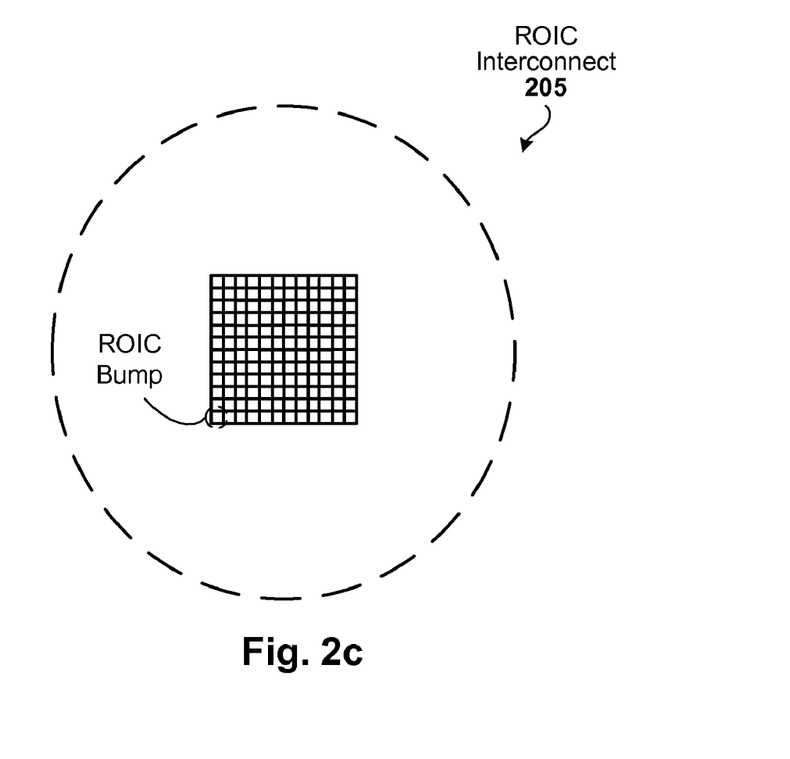
FIG. 2c illustrates an example ROIC interconnect for the readout reducer shown in FIG. 2.

FIG. 2b illustrates an example array of anode pads 201, and FIG. 2c illustrates an example ROIC interconnect 205. This example embodiment includes a 12 by 12 array of anode pads, and disregards pads outside the 12 by 12 anode pad array, and assumes a one-to-one correspondence between anode pads and ROIC interconnect pads (sometimes called ROIC bumps). As will be appreciated, however, the 12×12 array is provided for ease of depiction, and actual applications are effectively limited only by the unit cell size of the ROIC that is employed. Typical ROIC arrays would include a much larger number of pixels. For instance, standard ROIC arrays include those ranging from 128×128 to 1024×1024 bumps. Other array sizes may be used as well, and they need not be square or otherwise conform to any particular shape.

Figure 2D:
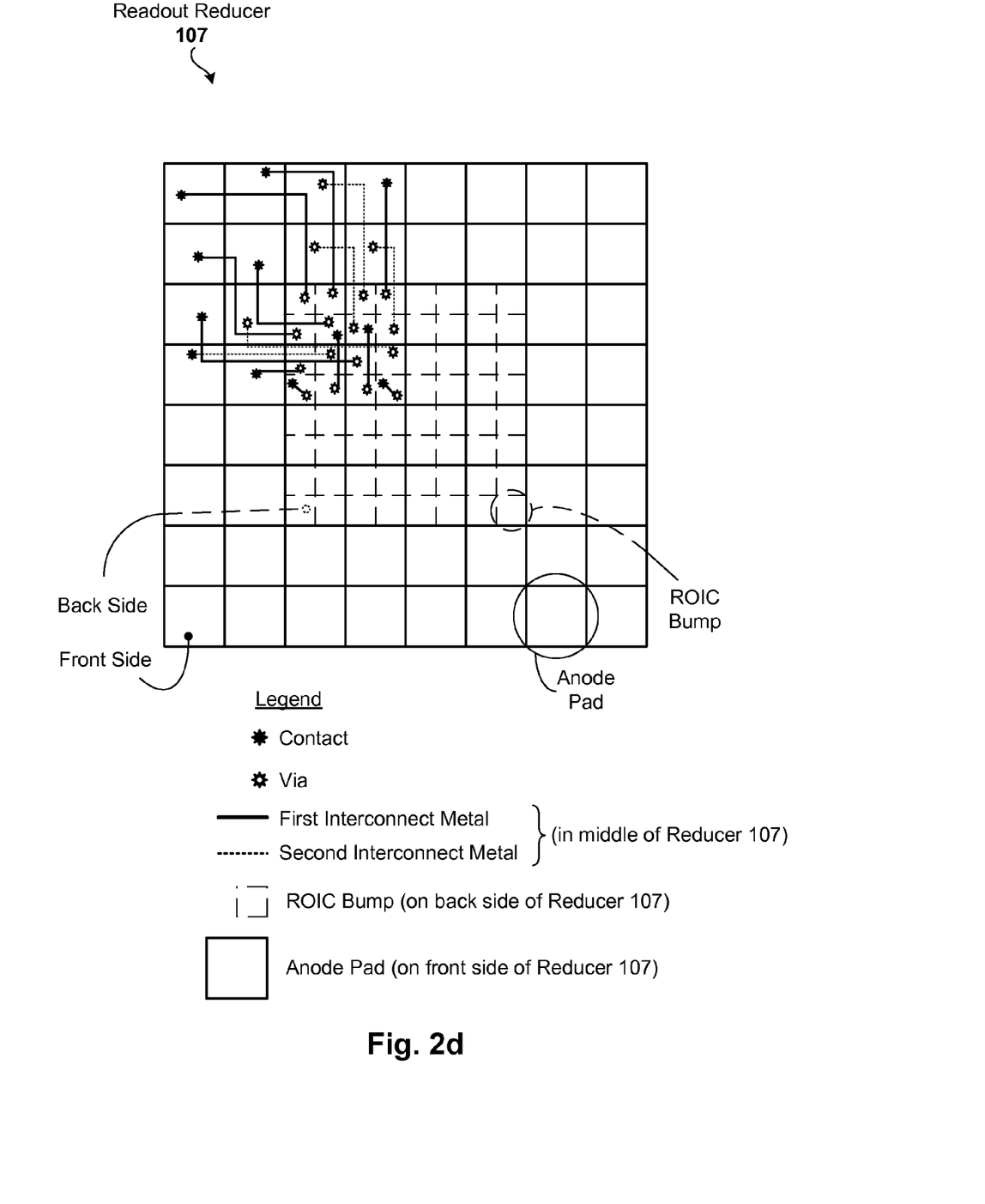
FIG. 2d illustrates a see-through view that shows example features of the readout reducer shown in FIG. 2a, configured in accordance with an embodiment of the present invention.

FIG. 2d illustrates a see-through view that shows example features of the readout reducer 107 (including otherwise unseen features in the middle of the reducer), configured in accordance with an embodiment of the present invention. As can be seen, the front side of the reducer 107 includes an 8 by 8 array of anode pads and the back side of the reducer 107 includes a smaller 8 by 8 array of ROIC bumps (shown with a dashed grid). In this example embodiment, the N interconnect layers 203 include two interconnect layers (metals) between the anode 201 and ROIC interconnect 205. One quadrant of the interconnect layers is shown, and that pattern can be repeated in the other three quadrants (as a mirror image over the x and y axes) to completely connect the 8 by 8 array of anode pads to the smaller 8 by 8 array of ROIC bumps. Such physical symmetry from quadrant to quadrant allows for desirable symmetry in other aspects of the circuitry (e.g., with respect to propagation delays, capacitive loading, etc). For instance, to map a 256×256 array, conventional routing tools could be used to simplify the process and eliminate errors. The tools can be used to set upper and lower limits on the capacitance of each mapped pixel thereby setting a limit on the threshold variation at the input of the ROIC device (e.g., Medipix) due to differing electronic charge.

The first interconnect layer/metal (shown with bold solid lines) in this example is used to connect each of 11 of the 16 front side anode pads to a corresponding one of the back side ROIC bumps. Each of the other 5 front side anode pads are coupled to a corresponding one of the back side ROIC bumps by the second interconnect metal (shown in thinner dotted lines). Note that the number in the subsets of distinct pads can vary from one configuration to the next. As can be seen in this example embodiment, each of the anode pads are connected to one of the interconnect layers by either a metal contact (shown as solid star) or a metalized via (shown as hollow star), and each of the ROIC bumps are connected to one of the interconnect layers by a metalized via. As will be appreciated in light of this disclosure, using multiple distinct layers of interconnect metal between the anode 201 and ROIC interconnect 205 allows the reducer 107 to interface a large anode pad array on a pixel-by-pixel basis to the smaller ROIC interconnect array (i.e., so that a conductive run coupling an anode/ROIC pixel pair does not intersect or otherwise short to a conductive run coupling another anode/ROIC pixel pair). Thus, smaller arrays may only require one interconnect metal layer between the anode 201 and ROIC interconnect 205, where each individual anode pad can be coupled to its corresponding ROIC bump with a conductive path that does not interfere with the conductive paths between other anode pad and ROIC bump pairs. Similarly, larger arrays may require 3 or more distinct interconnect metal layers between the anode 201 and ROIC interconnect 205 to ensure that individual conductive runs between anode pad and ROIC bump pairs are not shorted together. Numerous suitable conductive run, contact, and via schemes can be used, as will be appreciated in light of this disclosure.

Thus, the readout reducer 107 as described herein can be used, for instance, to interface a standard integrated circuit such as a ROIC to a large format MCP, and can be effectively used to increase the apparent pixel size of the ROIC. For example, and with reference to FIG. 2d, assume that each ROIC bump (essentially, a ROIC pixel) is a 55 micron pixel corresponding to a ROIC 109 based on Medipix 2 and prototype Medipix 3 devices. For graphical simplicity, further assume that each anode pad is twice this size at 110 microns. A Medipix ROIC has 256×256 pixels; therefore, the size of the largest MCP active area that can be used in this example is 28.16 mm. Variations will be apparent in light of this disclosure. For example, to match a Medipix 256×256 ROIC to an MCP having an active area of 25 mm, the anode pads (pixels) of the readout reducer 107 could be set, for instance, at 100 microns. An anode pad size of 98 microns would even further optimize pixilation of the 25 mm active area of the MCP. The Medipix ROICs are designed to be bump bonded to pads, which makes them compatible with a readout reducer 107 having a ROIC interconnect 205 as described herein.

Fabrication Techniques

Figure 3A:
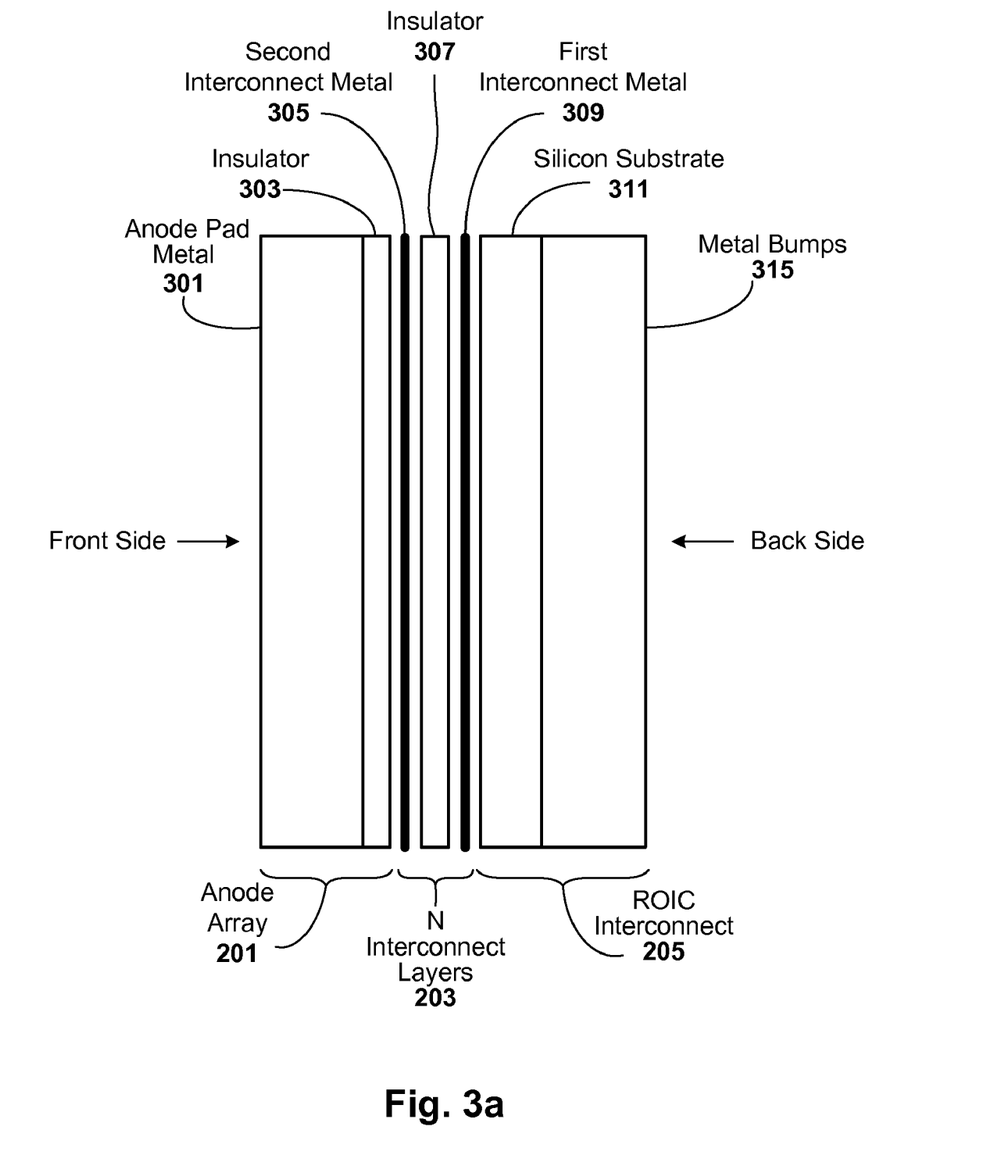
FIG. 3a illustrates a detailed side view of a readout reducer configured in accordance with an embodiment of the present invention.
Figure 3B:
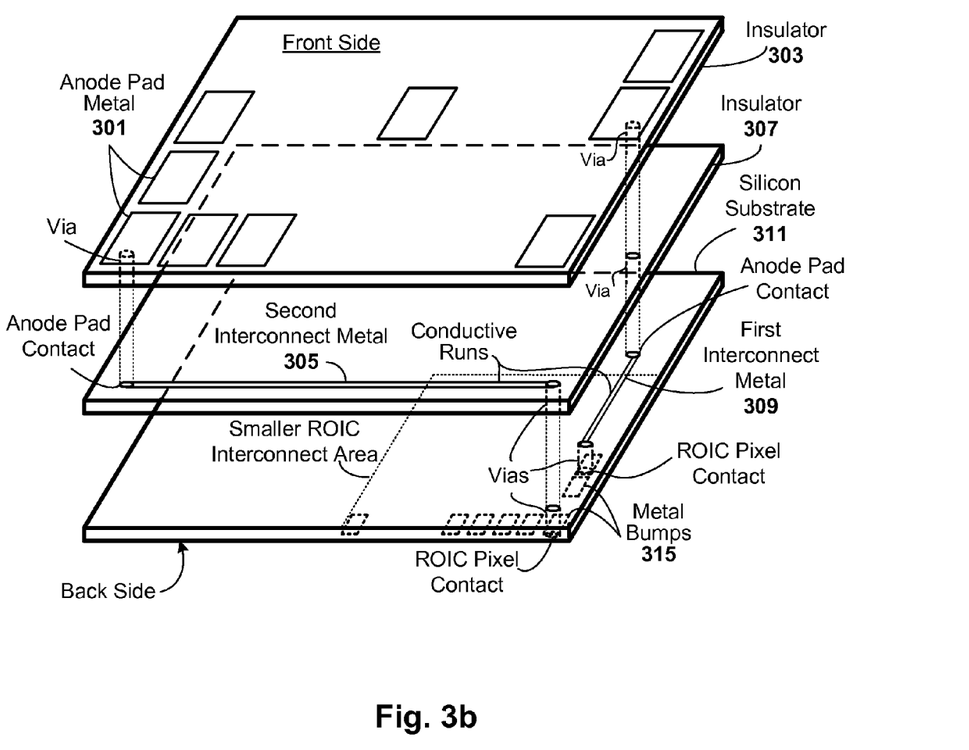

FIG. 3a illustrates a detailed side view of a readout reducer configured in accordance with an embodiment of the present invention, and FIG. 3b illustrates an exploded perspective view of the readout reducer shown in FIG. 3a. As can be seen, this example embodiment is formed on a silicon substrate 311. The readout reducer can be formed, for instance, using standard semiconductor and photolithography processing techniques.

In more detail, the first interconnect metal 309 is deposited onto silicon substrate 311, masked to provide the desired pattern of conductive runs, contacts, and vias, and then etched to remove the unmasked metal. Once the first interconnect layer metal is patterned, the insulator layer 307 is deposited, upon which the second interconnect metal 305 is deposited. The second interconnect metal 305 is then masked to provide the desired pattern of conductive runs, contacts, and vias, and then etched to remove the unmasked metal. Insulator 303 is then deposited on the second interconnect layer 305, upon which the anode pad metal 301 is deposited. The anode pad metal 301 is then masked to provide the desired pattern of anode pad, and then etched to remove the unmasked metal. The assembly can then be processed to form the ROIC interconnect 205 on the other side of the substrate 311, where metal is deposited, patterned, and then etched to provide the array of metal bumps 315.

FIG. 3b shows a select few examples of anode pads 301, anode contact pads, vias, conductive runs, and metal bumps 315; the full complement of such features is not shown to simplify depiction and avoid clutter that would otherwise impede figure clarity. Additional semiconductor processing steps (such as intermediate cleaning steps, and/or additional photolithography steps) may be used, as needed to form the vias and other circuit features. As can be seen, metalized vias are used to connect from the anode pads 301 on one side of the reducer and through the middle metal traces to metal bumps 315 on the other side.

In one specific embodiment, the anode pad metal 301 is gold, and is deposited in a layer that is about one micron thick. Each of the insulator layers 303 and 307 are silicon dioxide, and is deposited in a layer that is about one to two microns thick. Each of the first and second interconnect metal layers 309 and 305 are also implemented with gold and have conductive runs or traces that are around 1 micron thick and about 1 micron wide. In some embodiments, the width of short runs can be reduced so that they have substantially the same propagation delay of longer runs (e.g., where the propagation delays of short and long channel are within 10% of one another). Such a configuration may be useful, for instance, when there is charge sharing between pixels and it is desirable to count this as one event. In a more general sense, the interconnect layers 305 and 308 may include a plurality of varying length conductive runs, each having geometry configured to provide a propagation delay within a target range (e.g., within 5 to 50 percent of one another, depending on application demands). The metal bumps 315 of this specific example embodiment are implemented with indium and are three to five microns thick. The substrate 311 is around 2 mm thick, which provides mechanical stability. Recall that a silicon-based design may be beneficial since silicon is readily available at low cost and will match a silicon ROIC so that thermal expansion is not an issue.

Other embodiments may use different materials and/or dimensions and feature sizes, and the present invention is not intended to be limited to any particular set of materials or dimensions. Numerous variations will be apparent in light of this disclosure. For instance, substrate 311 may be implemented with gallium arsenide, or indium gallium arsenide, or other suitable substrate materials that provide comparable thermal qualities to the ROIC 109. The insulator layers 303 and 307 can be, for example, glass, or polymer, or other such suitable insulator material. The first and second interconnect metal layers 309 and 305 can be implemented, for instance, with indium, or platinum, or aluminum or other suitable conductive material. The metal bumps 315 can be implemented, for example, with gold, or platinum, or other suitable bump metal. Different fabrication methods may be used as well, such as those associated with making single or multilayer printed circuit boards (including masking, dipping, etching, pressing, drilling, etc). As will be appreciated, factors such as feature size and fabrication technique may limit or otherwise dictate the type of materials that can be used to form the readout reducer.

Anode Array with Flexible Pad Geometry

Figure 4:
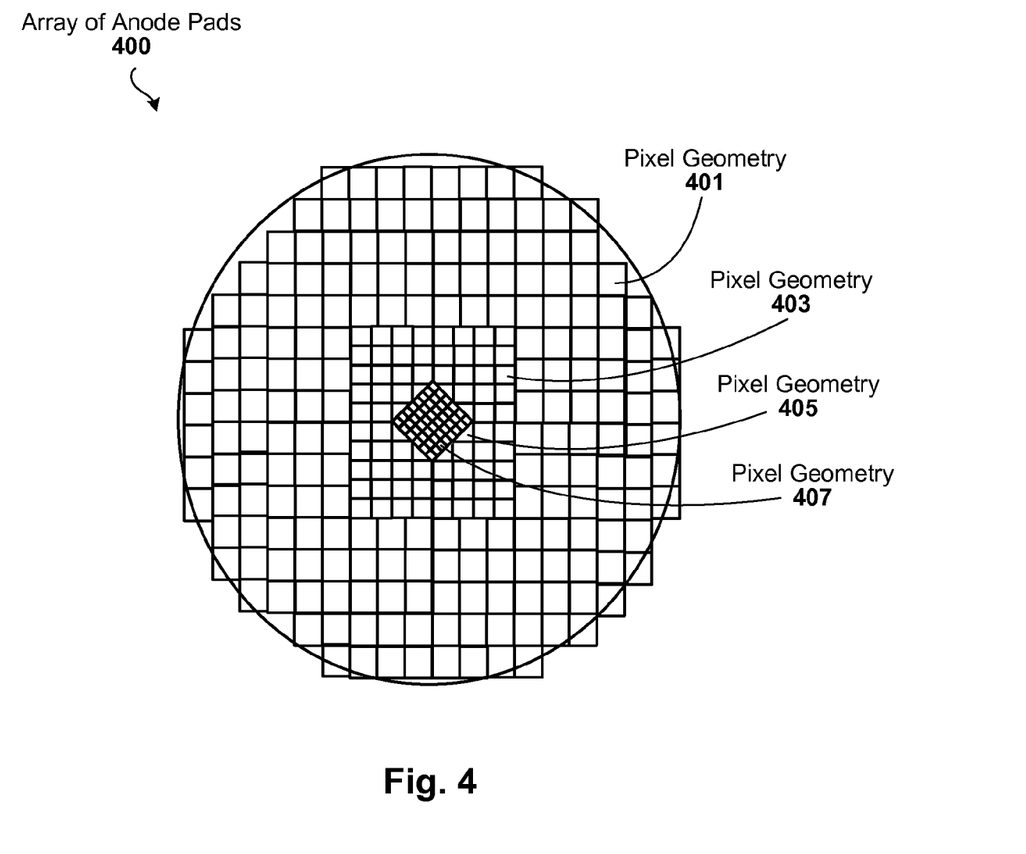
FIG. 4 illustrates an example array of anode pads for the readout reducer wherein the pads have a flexible geometry, in accordance with another embodiment of the present invention.

FIG. 4 illustrates an example array of anode pads 400 for the readout reducer wherein the pads have a flexible geometry, in accordance with another embodiment of the present invention. As explained herein, the readout reducer effectively decouples the anode geometry from the readout geometry, thereby enabling variations in the size and shape of the anode pixel.

Readout circuits for MCP based devices may use an integrated circuit that is either internal to the tube (e.g., electron bombarded) or external (e.g., using a faceplate and/fiber optic taper). The ROIC for such devices use a constant size pixel over the array. However, and in accordance with one embodiment of the present invention, the readout reducer enables a variable size and shape of the pixel to be used over the field of view (FOV) of the detector of which the MCP is part. In particular, the readout reducer may be configured with a segmented anode having flexible geometry. Such a configuration allows for compensation of optical blur variations over the FOV and provides near 100% fill factor. Moreover, the pixel distribution can be tailored for a given application, such as increasing the number of pixels in the center of the readout to improve resolution (e.g., such as in the way human eyes operate).

Conventional compensation for the variation of blur is typically done by calibration of the detector and correction by a signal processing algorithm. In contrast, the compensation for the variation of blur in accordance with an embodiment of the present invention can be accomplished by adjusting the size and possibly the shape of the anode pixel to provide a constant relationship of the blur circle to the pixel size (i.e., near constant pixel to blur ratio).

Other benefits will be apparent in light of this disclosure. For instance, a flexible geometry segmented anode also reduces the amount of image processing required, and may allow for the use of lower cost optics that do no require aspheric surfaces. In addition, all the active area of the anode (e.g., 256×256) can be used. The flexible geometry segmented anode also allows for implementation of advanced detectors, such as a foveal sensor having denser pixel resolution in some areas as compared to other areas (which is particularly useful in trackers and seekers and surveillance applications where the sensor is controlled by a pointing mechanism). Such a configuration is of particular interest for systems that are used for tracking and guidance. In one such embodiment, a gimbaled optical system will position the region or object of interest to the center of the FOV, where many more pixels are available to increase the number of pixels on target, thereby increasing the spatial information available for processing. Also, R-theta pixel layouts are supported, as is shaping the FOV edge response. The flexible geometry segmented anode further supports a curved focal plane array (FPA), while allowing the ROIC to remain planer. In addition, a flexible geometry segmented anode effectively extends the ROIC life, by shielding the silicon from electron bombardment.

In the example embodiment anode array 400 shown in FIG. 4, there are four distinct pixel geometries: 401, 403, 405, and 407. This flexible anode geometry can be implemented, for example, by depositing the anode metal, masking the desired pattern including the desired pixel geometries, and then etching to provide the array of pads having the various distinct pixel geometries. Other suitable fabrication techniques will be apparent in light of this disclosure, depending on factors such as feature size and type of substrate (e.g., silicon substrate or PCB). Since only a small separation between anode pads is required to provide low voltage electrical isolation in a vacuum, the fill factor can be near 100%. In this particular example, the size of pixel geometry 407 is smaller than the other geometries, and the geometries 403 and 405 around the 407 area are in the middle size range, and geometry 401 is the largest pixel size. As such, the density of pixels is higher in the center of the array, thereby emulating the human eye's fovea region. This feature supports improved resolution in applications such as seekers and surveillance (e.g., facial recognition).

The readout reducer can have a curved anode array to provide another technique for compensating for optical distortions. This can be accomplished, for example, by building up the thickness on the anode side of the readout reducer (e.g., using selective deposition and etching techniques), while maintaining the planarity of the readout side. Note, however, that this benefit will have to be balanced with the increased spreading of the electron cloud as the center of the array may be further from the MCP (due to the non-planarity of the anode array).

In addition, the anode pixels (pads) can have any size distribution and shape that will efficiently pack to yield a high fill factor. Only polygonal shapes (e.g., square, rectangular, triangle, etc) are shown in FIG. 4, but curved shapes may be used as well, with the understanding that curved pixel shapes may decrease fill factor. In any case, the total number of anode pads effectively defines the total number of pixels, which in turn match the total number of pixels in the ROIC.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A readout reducer device for interfacing a multi-channel sensor with a readout integrated circuit (ROIC), the device comprising:
   an array of anode pads, each anode pad for receiving a detection signal from a corresponding channel of the sensor;
   a ROIC interconnect having an array of ROIC pads that couples to a corresponding array of the ROIC; and
   at least one interconnect layer for physically connecting each anode pad to a corresponding one of the ROIC pads;
   wherein the array of anode pads is a different size than the array of ROIC pads.

2. The device of claim 1 wherein the sensor is a microchannel plate (MCP) and the array of anode pads is larger than the array of ROIC pads.

3. The device of claim 1 wherein the device includes first and second interconnect layers, wherein the first interconnect layer physically connects some of the anode pads to their respective ROIC pads, and the second interconnect layer physically connects others of the anode pads to their respective ROIC pads.

4. The device of claim 1 wherein the at least one interconnect layer is formed on a silicon substrate.

5. The device of claim 1 wherein the at least one interconnect layer includes at least one of a conductive run, contact pad, and a metallized via to physically connect an anode pad to a corresponding ROIC pad.

6. The device of claim 1 wherein at least some of the anode pads of the anode array have a first shape and/or size and other anode pads of the anode array have a second shape and/or size.

7. The device of claim 1 wherein the array of anode pads is curved and the ROIC interconnect is planar.

8. The device of claim 1 wherein the anode array has denser pixel resolution in some areas as compared to other areas of the anode array.

9. The device of claim 1 wherein the at least one interconnect layer includes a plurality of varying length conductive runs, each having geometry configured to provide a propagation delay within a target range.

10. The device of claim 9 wherein a short conductive run has a narrower width than a relatively longer conductive run, so that the short conductive run has a propagation delay that is about the same as propagation delay of the long conductive run.

11. A readout reducer device for interfacing a microchannel plate (MCP) with a readout integrated circuit (ROIC), the device comprising:
    an array of anode pads, each anode pad for receiving a detection signal from a corresponding channel of the MCP;
    a ROIC interconnect having an array of ROIC pads that couples to a corresponding array of the ROIC; and
    at least one interconnect layer for physically connecting each anode pad to a corresponding one of the ROIC pads, the at least one interconnect layer including at least one of a conductive run, contact pad, and a metallized via;
    wherein the array of anode pads is larger than the array of ROIC pads.

12. The device of claim 11 wherein the device includes first and second interconnect layers, wherein the first interconnect layer physically connects some of the anode pads to their respective ROIC pads, and the second interconnect layer physically connects others of the anode pads to their respective ROIC pads.

13. The device of claim 11 wherein at least some of the anode pads of the anode array have a first shape and/or size and other anode pads of the anode array have a second shape and/or size.

14. The device of claim 11 wherein the anode array has denser pixel resolution in some areas as compared to other areas of the anode array.

15. The device of claim 11 wherein the at least one interconnect layer includes a plurality of varying length conductive runs, each having geometry configured to provide a propagation delay within a target range.

16. A system comprising:
    one or more optics for collecting photons from a scene within a field of view (FOV) of the system;
    a converter for converting photons collected by the optics to electrons;
    a microchannel plate (MCP) having a plurality of channels, each channel for amplifying an electron output by the converter into an electron cloud;
    a readout integrated circuit (ROIC) for converting each electron cloud into a signal for subsequent signal processing; and
    a readout reducer device for interfacing the MCP with the ROIC, the device comprising:
        an array of anode pads, each anode pad for receiving a detection signal from a corresponding channel of the MCP;
        a ROIC interconnect having an array of ROIC pads that couples to a corresponding array of the ROIC; and
        at least one interconnect layer for physically connecting each anode pad to a corresponding one of the ROIC pads, the at least one interconnect layer including at least one of a conductive run, contact pad, and a metallized via;
        wherein the array of anode pads is larger than the array of ROIC pads;
    wherein each of the MCP, readout reducer device, and ROIC are included in a vacuum.

17. The system of claim 16 wherein the readout reducer device includes first and second interconnect layers, wherein the first interconnect layer physically connects some of the anode pads to their respective ROIC pads, and the second interconnect layer physically connects others of the anode pads to their respective ROIC pads.

18. The system of claim 16 wherein at least some of the anode pads of the anode array have a first shape and/or size and other anode pads of the anode array have a second shape and/or size.

19. The system of claim 16 wherein the anode array of the readout reducer device has denser pixel resolution in some areas as compared to other areas of the anode array.

20. The system of claim 16 wherein the at least one interconnect layer includes a plurality of varying length conductive runs, each having geometry configured to provide a propagation delay within a target range.

* * * * *